(12) United States Patent
Chen et al.

(10) Patent No.: US 9,837,493 B2
(45) Date of Patent: Dec. 5, 2017

(54) SEMICONDUCTOR DEVICE AND METHOD FOR FABRICATING THE SAME

(71) Applicant: UNITED MICROELECTRONICS CORP., Hsinchu (TW)

(72) Inventors: Chien-Hung Chen, Hsinchu County (TW); Shih-Hsien Huang, Kaohsiung (TW); Yu-Ru Yang, Hsinchu County (TW); Huai-Tzu Chiang, Tainan (TW); Hao-Ming Lee, Taichung (TW); Sheng-Hao Lin, Hsinchu County (TW); Cheng-Tzung Tsai, Taipei (TW); Chun-Yuan Wu, Yunlin County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 14/940,867

(22) Filed: Nov. 13, 2015

(65) Prior Publication Data
US 2017/0104070 A1   Apr. 13, 2017

(30) Foreign Application Priority Data

Oct. 8, 2015   (CN) .......................... 2015 1 0644705

(51) Int. Cl.
*H01L 29/165* (2006.01)
*H01L 21/02* (2006.01)
(Continued)

(52) U.S. Cl.
CPC ...... *H01L 29/165* (2013.01); *H01L 21/02532* (2013.01); *H01L 21/02609* (2013.01); *H01L 21/3065* (2013.01); *H01L 21/30604* (2013.01); *H01L 29/0657* (2013.01); *H01L 29/1054* (2013.01); *H01L 29/66795* (2013.01); *H01L 29/785* (2013.01)

(58) Field of Classification Search
CPC ......... H01L 29/66795; H01L 21/02381; H01L 21/0245; H01L 21/0251; H01L 21/02521; H01L 21/02532; H01L 21/0254; H01L 21/02639; H01L 21/02647; H01L 21/7624; H01L 21/76251; H01L 21/76264; H01L 21/8258
USPC .. 257/E21.097, E21.102, E21.127, E21.131, 257/E21.132, E21.133, E21.403, E21.561, 257/E21.562, E21.603, E29.246, E29.298, 257/E33.005, 185, 188, 189, 190, 506; 438/22, 283, 44, 459, 481
See application file for complete search history.

(56) References Cited

U.S. PATENT DOCUMENTS 6,376,902 B1 * 4/2002 Arndt .................... H01L 33/486
257/100
6,975,011 B2 * 12/2005 Arndt ................ H01L 31/02005
257/100

(Continued)

*Primary Examiner* — William F Kraig
*Assistant Examiner* — Edward Chin
(74) *Attorney, Agent, or Firm* — WPAT, PC

(57) ABSTRACT

A semiconductor device comprises a semiconductor substrate and a semiconductor fin. The semiconductor substrate has an upper surface and a recess extending downwards into the semiconductor substrate from the upper surface. The semiconductor fin is disposed in the recess and extends upwards beyond the upper surface, wherein the semiconductor fin is directly in contact with semiconductor substrate, so as to form at least one semiconductor heterointerface on a sidewall of the recess.

7 Claims, 4 Drawing Sheets

(51) Int. Cl.
*H01L 21/306* (2006.01)
*H01L 21/3065* (2006.01)
*H01L 29/06* (2006.01)
*H01L 29/78* (2006.01)
*H01L 29/66* (2006.01)
*H01L 29/10* (2006.01)

(56) References Cited

U.S. PATENT DOCUMENTS

| | | | |
|---|---|---|---|
| 7,119,422 B2 * | 10/2006 | Chin | H01L 33/62 257/666 |
| 7,432,589 B2 * | 10/2008 | Yamamoto | B29C 45/14639 257/690 |
| 7,462,870 B2 * | 12/2008 | Nakashima | H01L 23/49562 257/81 |
| 7,635,915 B2 * | 12/2009 | Xie | H01L 33/62 257/692 |
| 7,799,592 B2 * | 9/2010 | Lochtefeld | H01L 29/66795 257/185 |
| 7,875,899 B2 * | 1/2011 | Yasuda | H01L 25/0753 257/88 |
| 7,888,699 B2 * | 2/2011 | Oshio | H01L 25/167 257/99 |
| 7,939,848 B2 * | 5/2011 | Kim | H01L 25/0753 257/100 |
| 7,977,706 B2 | 7/2011 | Lochtefeld | |
| 8,067,778 B2 * | 11/2011 | Bae | H01L 33/56 257/100 |
| 8,120,151 B2 * | 2/2012 | Ishi | H01L 31/02019 257/66 |
| 8,188,498 B2 * | 5/2012 | Kim | H01L 33/486 257/100 |
| 8,309,986 B2 | 11/2012 | Lochtefeld | |
| 8,368,112 B2 * | 2/2013 | Chan | H01L 33/62 257/666 |
| 8,378,347 B2 * | 2/2013 | Shimizu | H01L 24/97 257/100 |
| 8,628,989 B2 | 1/2014 | Lochtefeld | |
| 8,633,506 B2 * | 1/2014 | Kobayakawa | H01L 33/483 257/100 |
| 8,829,561 B2 * | 9/2014 | Lin | H01L 33/62 257/666 |
| 9,035,439 B2 * | 5/2015 | Xuan | H01L 33/486 174/536 |
| 2004/0256706 A1 * | 12/2004 | Nakashima | H01L 23/49562 257/678 |
| 2006/0049477 A1 * | 3/2006 | Arndt | H01L 33/62 257/433 |
| 2006/0157828 A1 * | 7/2006 | Sorg | H01L 31/0203 257/666 |
| 2006/0169976 A1 * | 8/2006 | Kameda | H01L 23/49575 257/44 |
| 2006/0292719 A1 * | 12/2006 | Lochtefeld | H01L 21/02381 438/22 |
| 2007/0290220 A1 * | 12/2007 | Wang | H01L 33/486 257/99 |
| 2008/0054284 A1 * | 3/2008 | Hussell | H01L 33/54 257/98 |
| 2008/0121921 A1 * | 5/2008 | Loh | H01L 33/642 257/99 |
| 2009/0289274 A1 * | 11/2009 | Park | H01L 33/62 257/99 |
| 2011/0186886 A1 * | 8/2011 | Watari | H01L 33/56 257/98 |
| 2011/0186900 A1 * | 8/2011 | Watari | H01L 24/97 257/99 |
| 2011/0186902 A1 * | 8/2011 | Egoshi | H01L 24/97 257/99 |
| 2012/0080701 A1 * | 4/2012 | Kim | H01L 33/486 257/98 |
| 2012/0103682 A1 * | 5/2012 | Chang | H01L 23/047 174/529 |
| 2012/0132931 A1 * | 5/2012 | Inoue | H01L 33/486 257/88 |
| 2015/0279725 A1 * | 10/2015 | Waldron | H01L 21/76251 257/506 |

* cited by examiner

SEMICONDUCTOR DEVICE AND METHOD FOR FABRICATING THE SAME

This application claims the benefit of People's Republic of China application Serial No. 201510644705.1, filed Oct. 8, 2015, the subject matter of which is incorporated herein by reference.

BACKGROUND

Technical Field

The disclosure relates in generally related to a semiconductor device and method for fabricating the same, and more particularly to a fin field-effect transistor (FinFET) and method for fabricating the same a.

Description of the Related Art

As the evolution of semiconductor process, a semiconductor device with higher drive current and smaller feature dimension is requested. In order to shrink the critical size of the semiconductor device and increase its reaction speed. A fin field effect transistor (fin field effect transistor, FinFET) technology has been applied to 32 nanometer-technology and a multi-gate device with higher functional density, lower power consumption and improved gate control over the channel potential is provided.

Recently, epitaxial stressor, such as epitaxial silicon germanium (SiGe) or silicon carbide (SiC), has applied to form the fin of the FinFET, so as to introduce strain into the channel of the FinFET to further improve the carrier mobility thereof. However, there may exit lattice mismatch between the epitaxial SiGe and the semiconductor substrate on which the fin is grown, thus dislocation may occur in the fin and deteriorate the electrical performance of the FinFET.

Therefore, there is a need of providing an improved semiconductor device and method for fabricating the same to obviate the drawbacks encountered from the prior art.

SUMMARY

One aspect of the present disclosure is to provide a semiconductor device, wherein the semiconductor device includes a semiconductor substrate and a semiconductor fin. The semiconductor substrate has an upper surface and a recess extending downwards into the semiconductor substrate from the upper surface. The semiconductor fin is disposed in the recess and extends upwards beyond the upper surface, wherein the semiconductor fin is directly in contact with semiconductor substrate, so as to form at least one semiconductor hetero-interface on a sidewall of the recess.

Another aspect of the present disclosure is to provide a method for fabricating a semiconductor device, wherein the method comprises steps as follows: Firstly, a semiconductor substrate having an upper surface and a recess extending downwards into the semiconductor substrate from the upper surface is provided. A semiconductor fin is then formed in the recess and extending upwards beyond the upper surface, wherein the semiconductor fin is directly in contact with semiconductor substrate, so as to form a semiconductor hetero-interface on at least one sidewall of the recess.

In accordance with the aforementioned embodiments of the present invention, a semiconductor device and a method for fabricating the same are disclosed. At least one recess is firstly formed in a semiconductor substrate extending downwards from an upper surface of the semiconductor substrate. An epitaxial growth process is then performed to form a semiconductor fin consisting of a semiconductor material other than that of semiconductor substrate and extending beyond the upper surface, wherein the semiconductor fin is directly in contact with semiconductor substrate, so as to form at least one semiconductor hetero-interface on a sidewall of the recess.

Since the recess formed in the semiconductor substrate can provide a lateral space to allow epitaxial defects laterally formed at the hetero-interface of the semiconductor substrate and the semiconductor fin, thus epitaxial defects formed in vertical direction can be blocked from extending upwards beyond the recess during the epitaxial growth process, and lattice distortion and dislocation may be restrained in the portion of the semiconductor fin beneath the level of the upper surface of the semiconductor substrate. As a result, the structural quality of the upper portion of the semiconductor fin formed by the epitaxial growth process can be improved, and the electrical performance of the semiconductor device therefore can be enhanced.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION

Figure 1A:
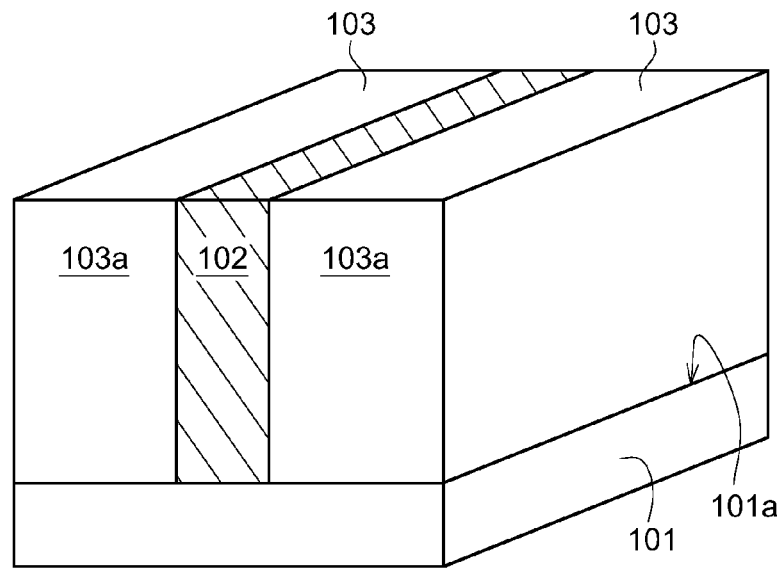
FIGS. 1A to 1D are prospective views illustrating the structures during the intermediate stage of the process for fabricating a semiconductor device in accordance with one embodiment of the present invention.
Figure 1B:
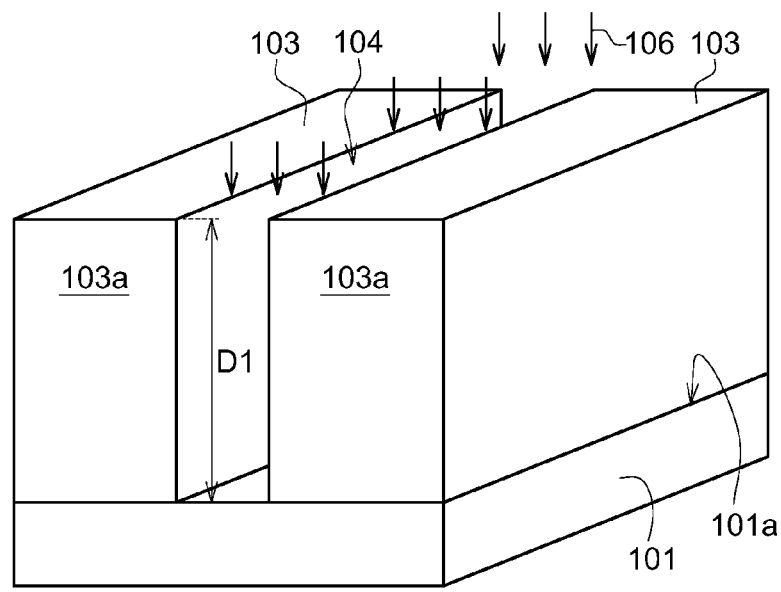
Figure 1C:
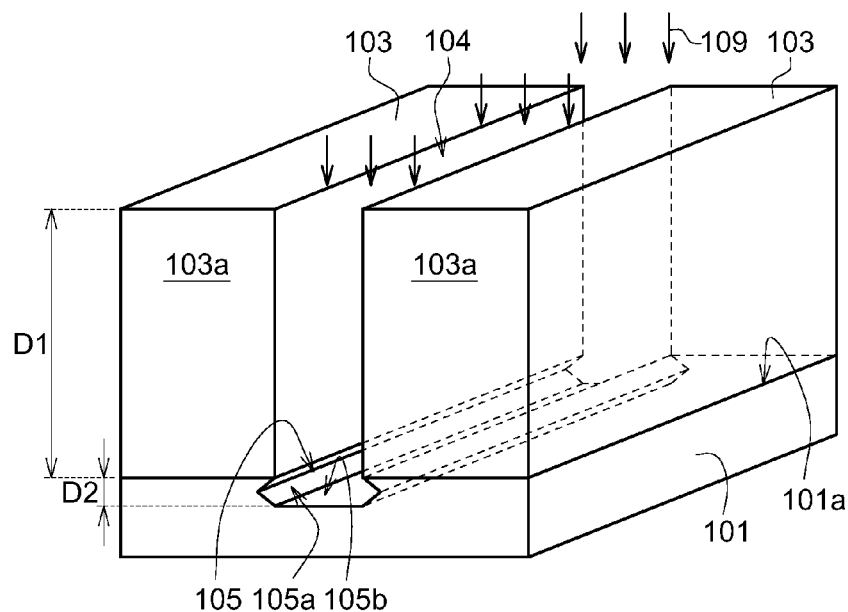

The embodiments as illustrated below provide a semiconductor device with at least one semiconductor fin and a method for fabricating the same to solve the questions on electrical performance deterioration due to lattice mismatch between the semiconductor fin and the semiconductor substrate. The present invention will now be described more specifically with reference to the following detailed embodiments and accompanying drawings.

It is to be noted that the following descriptions of preferred embodiments of this invention are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present invention. In addition, the illustrations may not be necessarily drawn to scale, and the identical elements of the embodiments are designated with the same reference numerals.

FIGS. 1A to 1D are prospective views illustrating the method for fabricating a semiconductor device 100 in accordance with one embodiment of the present invention. The method for fabricating the semiconductor device 100 includes several steps as follows: Firstly, a semiconductor substrate 101 having an upper surface 101a and at least one sacrificing fin 102 protruding thereon is provided.

In some embodiments of the present invention, the semiconductor substrate may be a single-crystal silicon layer, and the sacrificing fin is a silicon fin formed on the single-crystal silicon layer. In some other embodiments, the semiconductor substrate 101 can further include other layer, such as semiconductor layers consisting of semiconductor material other than single-crystal silicon or insulating layers (e.g. a silicon oxide layer). For example, in a preferred embodiment, the semiconductor substrate 101 can be a silicon-on-insulator (SOI) substrate. In the present embodiment, the semiconductor substrate 101 is a bulk substrate made of single-crystal silicon, and the sacrificing fin 102 is a silicon fin protruding from the upper surface 101a of the bulk substrate.

In some embodiments of the present invention, the process for providing the semiconductor substrate 101 may further include steps of forming a dielectric layer 103 on the upper surface 101a and the sacrificing fin 102, and performing a planarization process, such as a chemical-mechanical polishing (CMP) process, using the sacrificing fin 102 as a stop layer to remove a portion of the dielectric layer 103, so as to form two shallow trench isolations (STIs) 103a adjacent to the sacrificing fin 102 and to expose a portion of the sacrificing fin 102 (see FIG. 1A).

Next, the sacrificing fin 102 is removed to form a trench 104 between two adjacent STIs 103a, and a portion of the semiconductor substrate 101 is then removed at the same removing step to form a recess 105 extending down wards into the semiconductor substrate 101 from the upper surface 101a. In some embodiments of the present invention, the process for removing the sacrificing fin 102 includes a dry etching process 106, such as a reactive ion retching (RIE) process, using the STIs 103a (a photo-resist layer may be also available) as the etching mask to remove the sacrificing fin 102, so as to form the trench 104 and to expose a portion of the upper surface 101a from the trench 104 (see FIG. 1B).

However, the recess 105 may be formed in different way. In some embodiments of the present invention, after the trench 104 is formed, an isotropic etching process 109 is then performed on the exposed portion of the upper surface 101a to form the recess 105 extending down wards into the semiconductor substrate 101 from the upper surface 101a.

The recess 105 formed by the isotropic etching process 109 may shape as a bowl or a polyhedron or have an irregular shape. For example, in the present embodiment, a wet etching process using a mixing solution including nitric acid ($HNO_3$) and hydrofluoric acid (HF) as the etchant is performed on the portion of the upper surface 101a of the semiconductor substrate 101 exposed from the trench 104, so as to form a recess 105 in the semiconductor substrate 101 having a diamond shaped cross-sectional profile (see FIG. 1O). The depth D1 of the trench 104 measured upwards from the upper surface 101a of the semiconductor substrate 101 to the top end of the STIs 103a substantially ranges from 80 nm to 160 nm. The depth D2 of the recess 105 measured downwards from upper surface 101a of the semiconductor substrate 101 to the bottom of the recess 105 substantially ranges from 20 nm to 80 nm.

Subsequently, a semiconductor fin 107 is formed in the recess 105 and the trench 104 extending upwards and beyond the upper surface 101a of the semiconductor substrate 101, wherein the semiconductor fin 107 is directly in contact with semiconductor substrate 101, so as to form at least one semiconductor hetero-interface 108 on at least one sidewall 105a of the recess 105. The height H of the semiconductor fin 107 measured upwards from the bottom of the recess 105 substantially ranges from 100 nm to 240 nm; the lateral width W of the semiconductor fin 107 ranges from 5 nm to 10 nm; and the semiconductor fin 107 has an aspect ratio (the fraction of the height H over the lateral width W, H/W) substantially ranges from 10 to 20.

In some embodiments of the present invention, the forming of the semiconductor fin 107 including steps of depositing a first semiconductor material other than the material used to constitute the semiconductor substrate 101 in the recess 105 and the trench 104, so as to form at least one semiconductor hetero-interface 108 with dislocation in the portion of the semiconductor fin 107 between the two levels respectively parallel to the bottom surface 105b of the recess 105 and the upper surface 101a of the semiconductor substrate 101. Wherein the first semiconductor material used to form the semiconductor fin 107 can include germanium (Ge).

In addition, the Ge concentration in the epitaxial structure of the first semiconductor material may vary as it growing up during the deposition process for forming the semiconductor fin 107. For example, in the present embodiment, the first semiconductor material can be SiGe. The Ge concentration in the semiconductor fin 107 may be increased gradually along with the epitaxial direction from the bottom surface 105b of the recess 105 to the upper surface 101a of the semiconductor substrate 101. However, in another embodiment, the Ge concentration in the semiconductor fin 107 may be decreased gradually along with the epitaxial direction from the bottom surface 105b of the recess 105 to the upper surface 101a of the semiconductor substrate 101.

Figure 1D:
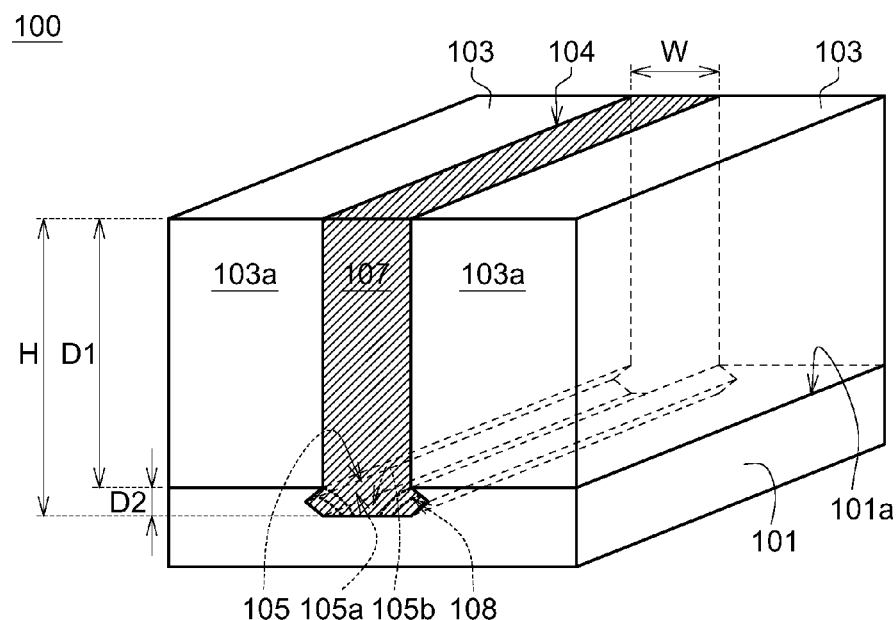

Next, series downstream processes are then carried out to form the semiconductor device 100 as shown in FIG. 1D. Since the recess 105 formed in the semiconductor substrate 101 can provide a lateral space to allow epitaxial defects laterally formed at the hetero-interface 108 of the semiconductor substrate 101 and the semiconductor fin 107, thus epitaxial defects formed in vertical direction can be blocked from extending upwards beyond the recess 105 during the epitaxial growth process, and lattice distortion and dislocation may be restrained in the portion of the semiconductor fin 107 beneath the level of the upper surface 101a of the semiconductor substrate 101. As a result, the structural quality of the upper portion of the semiconductor fin 107 formed by the epitaxial growth process can be improved, and the electrical performance of the semiconductor device 100 therefore can be enhanced.

Of note that, the process for forming the trench 104 and the recess 105 is not limited in this regard. In some other embodiments, the trench 104 and the recess 105 can be formed by the same etching process, e.g. the dry etching process for removing the sacrificing fin 102.

Figure 2A:
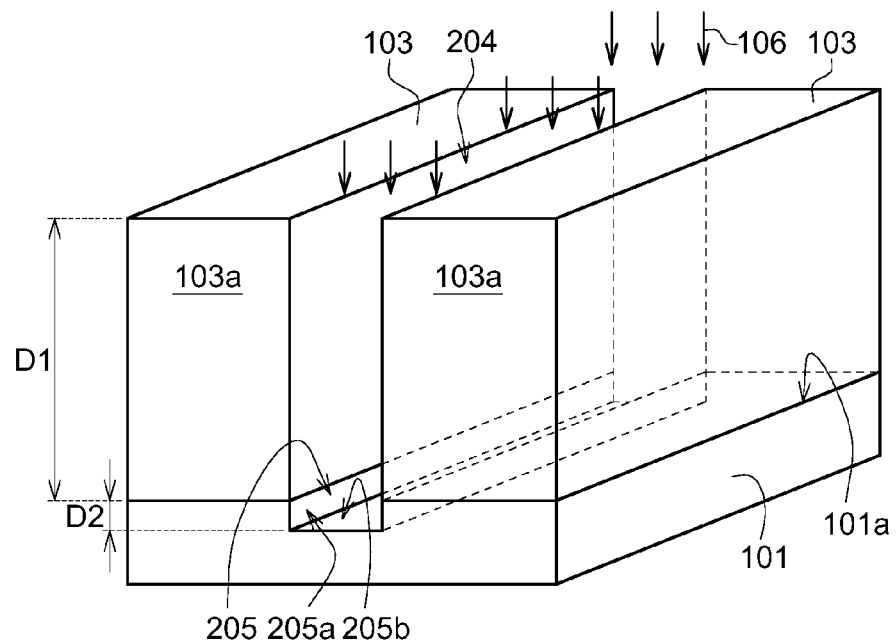
FIGS. 2A to 2C are prospective views illustrating the method for fabricating a semiconductor device in accordance with another embodiment of the present invention.
Figure 2B:
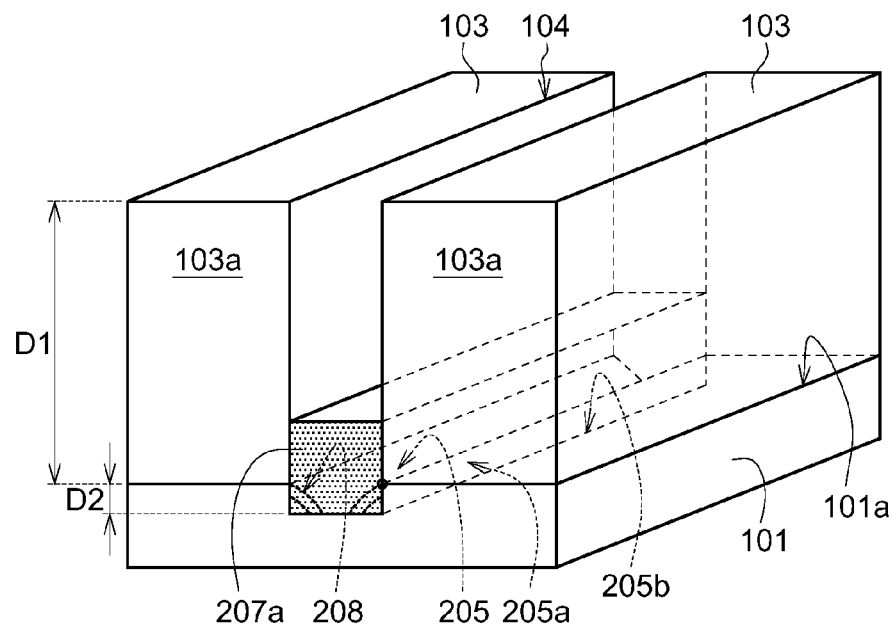
Figure 2C:
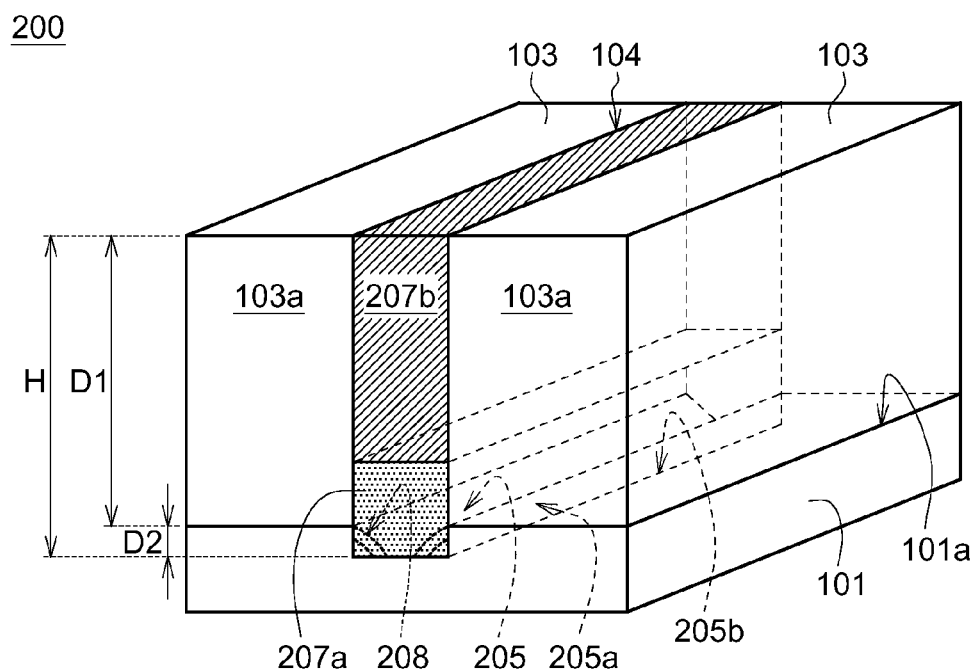

FIGS. 2A to 2C are prospective views illustrating the method for fabricating another semiconductor device 200 in accordance with another embodiment of the present invention. The processing steps and material for forming the semiconductor device 200 are similar to that for forming the semiconductor device 100 except the way and material for forming the recess 205 and the semiconductor fin 207. Since the method for forming the semiconductor substrate 101 having the sacrificing fin 102 are identical in these two approaches, thus the detailed process for forming the same will not be redundantly described. The detailed steps, structure and material for fabricating the semiconductor device 200 will be described from FIG. 1A.

In the present embodiment, see FIG. 2A, the trench 204 and the recess 205 are formed by the same etching process, e.g. the dry etching process 106 for removing the sacrificing fin 102. Such that, the trench 204 and the recess 205 have identical lateral section with the same size and shape.

Subsequently, a semiconductor fin 207 is formed in the recess 205 and the trench 204. In the present embodiment, the forming of the semiconductor fin 207 including steps of depositing a first semiconductor material other than the material used to constitute the semiconductor substrate 101 in the recess 205 and the trench 204, so as to form a first portion 207a of the semiconductor fin 207 and at least one semiconductor hetero-interface 208 with dislocation between the two levels respectively parallel to the bottom surface 205b of the recess 205 and the upper surface 101a of the semiconductor substrate 101 (see FIG. 2B).

Wherein the first semiconductor material used to form the semiconductor fin 107 can include Ge. In the present embodiment, the first portion 207a of the semiconductor fin 207 is made of SiGe and extends up wards from the bottom surface 205b of the recess 205 and beyond the level parallel to the upper surface 101a of the semiconductor substrate 101. The Ge concentration in the first portion 207a of the semiconductor fin 207 is increased gradually from the bottom surface 205b of the recess 205 to the upper surface 101a of the semiconductor substrate 101.

Next, a second semiconductor material that is different from the first semiconductor material used to constitute the first portion 207a of the semiconductor fin 207 is then deposited on the first portion 207a of the semiconductor fin 207, so as to form a second portion 207b of the semiconductor fin 207. In some other embodiments of the present invention, the second semiconductor material can be identical to the material used to constitute the semiconductor substrate 101. However, the second semiconductor material may not be limited in this regard. In some other embodiments of the present invention, the second semiconductor material may include semiconductor material other than that used to constitute the semiconductor substrate 101, such as the gallium arsenide (GaAs).

Series downstream processes are then carried out to form the semiconductor device 200 as shown in FIG. 2C. Since the recess 205 formed in the semiconductor substrate 101 can provide a lateral space to allow epitaxial defects laterally formed at the hetero-interface 206 of the semiconductor substrate 101 and the first portion 207a of the semiconductor fin 207, thus epitaxial defects formed in vertical direction can be blocked from extending upwards beyond the recess 205 during the epitaxial growth process, and lattice distortion and dislocation may be restrained in the first portion 207a of the semiconductor fin 207 beneath the level of the upper surface 101a of the semiconductor substrate 101. As a result, the structural quality of the second portion 207b of the semiconductor fin 207 formed by the epitaxial growth process can be improved, and the electrical performance of the semiconductor device 200 therefore can be enhanced.

In accordance with the aforementioned embodiments of the present invention, a semiconductor device and a method for fabricating the same are disclosed. At least one recess is firstly formed in a semiconductor substrate extending downwards from an upper surface of the semiconductor substrate. An epitaxial growth process is then performed to form a semiconductor fin consisting of a semiconductor material other than that of semiconductor substrate and extending beyond the upper surface, wherein the semiconductor fin is directly in contact with semiconductor substrate, so as to form at least one semiconductor hetero-interface on a sidewall of the recess.

Since the recess formed in the semiconductor substrate can provide a lateral space to allow epitaxial defects laterally formed at the hetero-interface of the semiconductor substrate and the semiconductor fin, thus epitaxial defects formed in vertical direction can be blocked from extending upwards beyond the recess during the epitaxial growth process, and lattice distortion and dislocation may be restrained in the portion of the semiconductor fin beneath the level of the upper surface of the semiconductor substrate. As a result, the structural quality of the upper portion of the semiconductor fin formed by the epitaxial growth process can be improved, and the electrical performance of the semiconductor device therefore can be enhanced.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device, comprising:
   a semiconductor substrate, having an upper surface and a recess extending downwards into the semiconductor substrate from the upper surface; and
   a semiconductor fin, disposed in the recess and extending upwards beyond the upper surface, wherein the semiconductor fin is directly in contact with semiconductor substrate, so as to form at least one semiconductor hetero-interface on a sidewall of the recess;
   wherein the semiconductor fin comprises a material other than that used to constitute the semiconductor substrate, and the material other than that used to constitute the semiconductor substrate has a germanium (Ge) concentration gradually decreased from a bottom surface of the recess to the upper surface.

2. The semiconductor device according to claim 1, wherein the recess has a bottom surface; and the semiconductor hetero-interface has a dislocation occurring between two levels respectively parallel to the bottom surface and the upper surface.

3. The semiconductor device according to claim 2, wherein the semiconductor substrate comprises silicon.

4. The semiconductor device according to claim 2, wherein the semiconductor fin comprises:
   a first portion, disposed on the semiconductor substrate, extending into the recess and forming the semiconductor hetero-interface with the semiconductor substrate; and
   a second portion, disposed on the first portion and including a semiconductor material that is different from that used to constitute the first portion.

5. The semiconductor device according to claim 2, wherein the recess has a depth substantially ranging from 20 nm to 80 nm, and the semiconductor fin has an aspect ratio substantially ranging from 10 to 20.

6. The semiconductor device according to claim 1, wherein the recess shapes as a bowl or a polyhedron or has an irregular shape.

7. The semiconductor device according to claim 1, further comprises a dielectric layer having a trench substantially aligning the recess and allowing the semiconductor fin formed therein.

* * * * *